(12) United States Patent
Park et al.

(10) Patent No.: US 9,118,035 B2
(45) Date of Patent: Aug. 25, 2015

(54) ORGANIC LIGHT-EMITTING DISPLAY APPARATUS AND METHOD OF MANUFACTURING THE SAME

(75) Inventors: Yong-Woo Park, Yongin (KR); Chun-Gi You, Yongin (KR); Joon-Hoo Choi, Yongin (KR); Won-Pil Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 169 days.

(21) Appl. No.: 13/468,438

(22) Filed: May 10, 2012

(65) Prior Publication Data
US 2013/0119387 A1    May 16, 2013

(30) Foreign Application Priority Data
Nov. 16, 2011    (KR) .................. 10-2011-0119784

(51) Int. Cl.
H01L 33/00    (2010.01)
H01L 51/52    (2006.01)
H01L 27/32    (2006.01)
H01L 33/44    (2010.01)

(52) U.S. Cl.
CPC ............ H01L 51/5284 (2013.01); H01L 27/32 (2013.01); H01L 33/44 (2013.01)

(58) Field of Classification Search
CPC ................. H01L 33/44; H01L 27/32
USPC ............... 257/59, 91, 98, 40; 438/34, 99
See application file for complete search history.

(56) References Cited

U.S. PATENT DOCUMENTS

| | | | | |
|---|---|---|---|---|
| 5,760,861 | A * | 6/1998 | Kim | ............................... 349/110 |
| 2003/0155860 | A1* | 8/2003 | Choi et al. | ..................... 313/498 |
| 2010/0149078 | A1 | 6/2010 | Kim et al. | |
| 2010/0296041 | A1* | 11/2010 | Kimura et al. | ................. 349/141 |
| 2011/0127499 | A1 | 6/2011 | Yoon et al. | |
| 2012/0319122 | A1* | 12/2012 | Ma | ................................ 257/72 |

FOREIGN PATENT DOCUMENTS

| | | | |
|---|---|---|---|
| JP | 2010-225481 | * 10/2010 | .............. H01J 11/02 |
| KR | 2003-0069434 | 8/2003 | |
| KR | 10-2006-0001710 | 1/2006 | |
| KR | 10-0971752 | 7/2010 | |
| KR | 10-2011-0059966 | 6/2011 | |

* cited by examiner

*Primary Examiner* — Jamie C Niesz
(74) *Attorney, Agent, or Firm* — Robert E. Bushnell, Esq.

(57) ABSTRACT

An organic light-emitting display apparatus includes: a substrate including an emission region and a non-emission region and having a recess formed in at least a portion of the non-emission region; a black matrix disposed in the recess; a thin film transistor disposed on the non-emission region of the substrate and including an active layer, a gate electrode, and source and drain electrodes; a pixel electrode disposed on the emission region of the substrate and electrically connected to one of the source and drain electrodes; an organic emission layer disposed on the pixel electrode; and an opposite electrode disposed on the organic emission layer.

18 Claims, 6 Drawing Sheets

ORGANIC LIGHT-EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 16 Nov. 2011 and there duly assigned Serial No. 10-2011-0119784.

BACKGROUND OF THE INVENTION

1. Field of the Invention

The present invention relates to an organic light-emitting display apparatus and a method of manufacturing the same.

2. Description of the Related Art

Organic light-emitting display apparatuses have drawn attention as next generation display devices because the weight and thickness of the organic light emitting display apparatus can be reduced and the organic light emitting display apparatuses have superior characteristics such as wide viewing angles, excellent contrast, and short response times.

An organic light-emitting display apparatus includes a region with circuit components, such as a thin film transistor or a capacitor, for driving of the organic light-emitting display apparatus along with an emission region where light is emitted from an organic emission layer. However, visibility is reduced as incident light is reflected by metal materials of a gate electrode and source and drain electrodes of the thin film transistor or the like included in the capacitor.

Conventionally, an additional member such as a polarizing film is attached to a surface where light is emitted to prevent external light reflection. However, when a polarizing film is attached, light efficiency is decreased and manufacturing cost is increased due to the polarizing film.

SUMMARY OF THE INVENTION

The present invention provides an organic light-emitting display apparatus that may reduce external light reflection without a polarizing film efficiently, and may improve contrast and light efficiency, and a method of manufacturing the organic light-emitting display apparatus.

The present invention also provides an organic light-emitting display apparatus that may easily perform subsequent processes by forming a black matrix without a height difference, and a method of manufacturing the organic light emitting display apparatus.

The present invention also provides an organic light-emitting display apparatus that may reduce gas occurrence by increasing adhesion strength between a substrate and a black matrix, and a method of manufacturing the organic light-emitting display apparatus.

The present invention also provides an organic light-emitting display apparatus in which bezels disposed in a non-display region of an organic light-emitting display apparatus are omitted, and a method of manufacturing the organic light-emitting display apparatus.

According to an aspect of the present invention, there is provided an organic light-emitting display apparatus which may include: a substrate including an emission region and a non-emission region, and having a recess formed at least in a portion of the non-emission region; a black matrix disposed in the recess; a thin film transistor disposed on the non-emission region of the substrate and including an active layer, a gate electrode and source and drain electrodes; a pixel electrode disposed on the emission region of the substrate and electrically connected to one of the source and drain electrodes; an organic emission layer disposed on the pixel electrode; and an opposite electrode disposed on the organic emission layer.

The recess may be formed throughout the non-emission region.

The recess may be formed in a surface facing the thin film transistor of the substrate.

The recess may be formed in a surface opposite the surface facing the thin film transistor of the substrate.

A depth of the recess and a thickness of the black matrix may be the same.

The black matrix may include an organic material or an organic-inorganic hybrid material.

An adhesive member disposed between the substrate and the black matrix may be further included.

The non-emission region may include a non-display region corresponding to an edge region of the substrate.

The recess may be formed in the non-display region.

According to another aspect of the present invention, there is provided a method of manufacturing an organic light-emitting display apparatus which may include: forming a recess at least in a portion of a non-emission region of a substrate comprising an emission region and the non-emission region; forming a black matrix in the recess; forming a thin film transistor comprising an active layer, a gate electrode, and source and drain electrodes on the non-emission region of the substrate; forming a pixel electrode which is electrically connected to one of the source and drain electrodes; forming an organic emission layer on the pixel electrode; and forming an opposite electrode on the organic emission layer.

The forming of the recess may include forming the recess throughout the non-emission region.

The forming of the recess may include forming the recess along edges of the substrate.

The forming of the recess may include forming the recess in a surface facing the thin film transistor of the substrate.

The forming of the recess may include forming the recess in a surface opposite the surface facing the thin film transistor of the substrate.

The forming of the recess may include forming the recess using photolithography, inkjet patterning, or laser ablation.

The forming of the black matrix may include forming the black matrix to have a same thickness as a depth of the recess.

The black matrix may include an organic material or an organic-inorganic hybrid material.

The method may further include forming/applying an adhesive member in the recess before forming the black matrix.

The forming of the black matrix may include forming the black matrix using a printing method.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 9 is a schematic cross-sectional view of an organic light-emitting display apparatus according to another embodiment of the invention;

FIG. 10 is a schematic cross-sectional view of an organic light-emitting display apparatus according to another embodiment of the invention;

DETAILED DESCRIPTION OF THE INVENTION

As used herein, the term "and/or" includes any and all combinations of one or more of the associated listed items.

The present invention will now be described more fully with reference to the accompanying drawings in which exemplary embodiments of the invention are shown.

Figure 1:
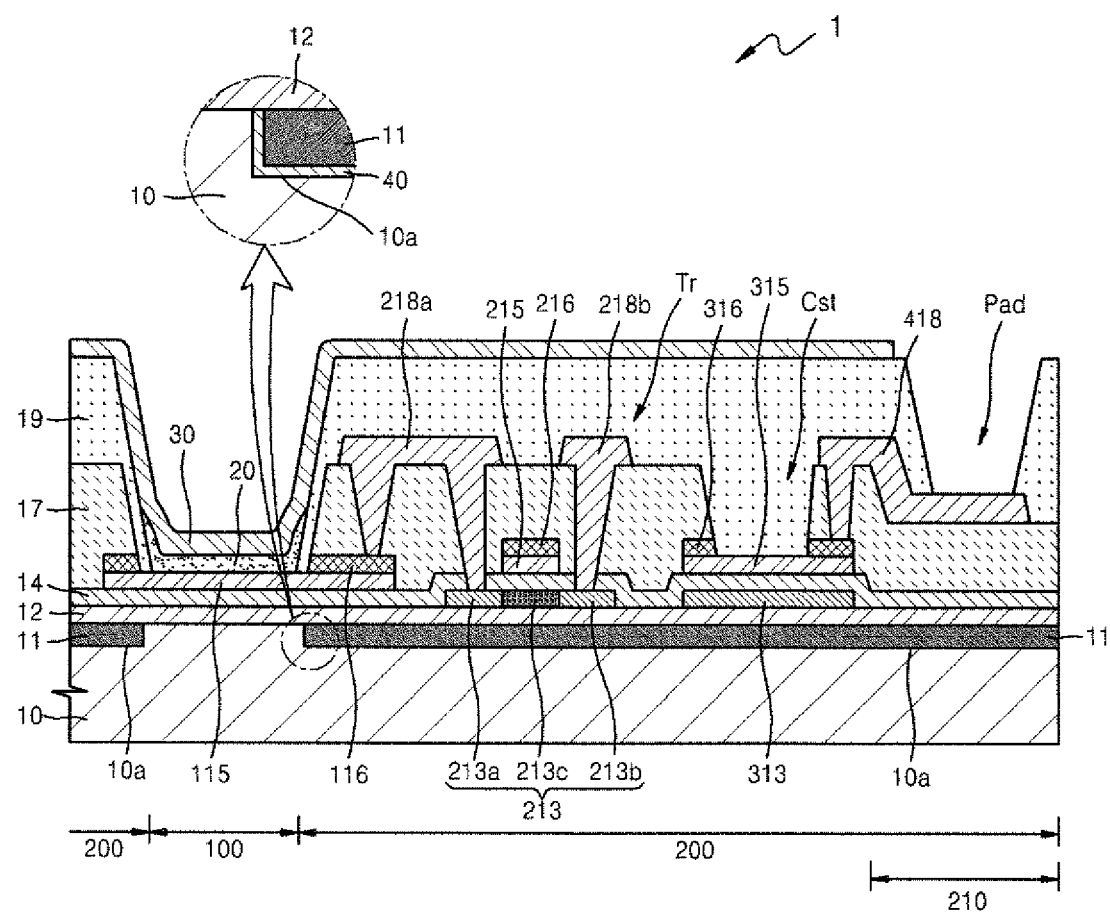
FIG. 1 is a schematic cross-sectional view of an organic light-emitting display apparatus according to an embodiment of the invention.

FIG. 1 is a schematic cross-sectional view of an organic light-emitting display apparatus 1 according to an embodiment of the invention.

Referring to FIG. 1, the organic light-emitting display apparatus 1 according to the present embodiment may include: a substrate 10 which includes an emission region 100 and a non-emission region 200, and which has a recess 10a formed at least in a portion of the non-emission region 200; a black matrix 11 which is disposed in the recess 10a; a thin film transistor Tr which is disposed on the non-emission region 200 of the substrate 10, and which includes an active layer 213, first and second gate electrodes 215 and 216, respectively, and source and drain electrodes 218a and 218b, respectively; a pixel electrode 115 which is disposed on the emission region 100 of the substrate 10, and which is electrically connected to one of the source and drain electrodes 218a and 218b, respectively; an organic emission layer 20 which is disposed on the pixel electrode 115; and an opposite electrode 30 which is disposed on the organic emission layer 20.

The substrate 10 may be formed of a transparent glass material having $SiO_2$ as a main component. However, aspects of the present invention are not limited thereto, and other materials, such as a transparent plastic material, may be used for forming the substrate 10. The substrate 10 of the current embodiment may be formed of a light-transmittable transparent material, and the light emitted from the organic emission layer 20 may transmit through the substrate 10 and be emitted to the outside.

The substrate 10 may include the emission region 100 that corresponds to the organic emission layer 20, and the non-emission region 200 that corresponds to the thin film transistor Tr, a capacitor Cst and a pad Pad. The non-emission region 200 may include a non-display region 210 corresponding to an edge region of the substrate 10, and the pad Pad, and an integrated circuit (IC) (not shown), etc. may be disposed in the non-display region 210. In the current embodiment, the recess 10a may be formed throughout the non-emission region 200 of the substrate 10, the black matrix 11 is disposed in each of the recesses 10a, and the recess 10a and the black matrix 11 are disposed on a surface facing the thin film transistor Tr of the substrate 10.

The black matrix 11 is buried throughout the recess 10a. That is, a depth of the recess 10a and a thickness of the black matrix 11 are the same, and the thickness of the black matrix 11 may be within a range from about 0.1 um to about 100 um.

The thickness of the black matrix 11 may be appropriately selected by considering prevention of external light reflection and light efficiency of the organic light-emitting display apparatus 1.

When the black matrix 11 is disposed on the substrate 10 excluding the recess 10a, subsequent processes are affected due to the height difference formed by the black matrix 11 having a certain thickness to prevent external light reflection. A buffer layer 12 may be formed to cover the black matrix 11. However, because the buffer layer 12 is preferably formed thin considering light efficiency, removing the height difference formed by the black matrix is limited.

However, in the current embodiment, the recess 10a is formed in the substrate 10, and the black matrix 11 is buried in the recess 10a so that planarization may be realized, and thus subsequent processes are not affected.

The black matrix 11 may be formed of an organic material or an organic-inorganic hybrid material, and may include a light-blocking material, such as a metal thin layer, metal particles, carbon black, and a mixture containing carbon black. However, aspects of the present invention are not limited thereto, and any light-blocking material may be used as a material for the black matrix 11.

To improve adhesion strength between the substrate 10 and the black matrix 11, an adhesive member 40 may be formed in the recess 10a before the black matrix 11 is formed.

The adhesive member 40 may be frit, and the black matrix 11 may be formed of an organic material or an organic-inorganic hybrid material preferably. The frit, a ceramic material, may be disposed in the recess 10a and melted by irradiating a laser or the like thereon, and the black matrix 11 may be formed in the recess 10a to improve adhesion strength between the substrate 10 and the black matrix 11.

When adhesive strength between the substrate 10 and the black matrix 11 is reduced, gas may be generated from the black matrix 11 including an organic material, and the gas may affect the subsequent processes, which are performed in a vacuum chamber.

When adhesive member 40 is disposed between the substrate 10 and the black matrix 11, generation of the gas may be reduced or prevented.

In this regard, the adhesive member 40 is not limited to frit, and the adhesive member 40 may even be omitted.

After forming the black matrix 11, the buffer layer 12 may be formed on the entire surface of the substrate 10. The buffer layer 12 may be formed of silicon nitride ($SiN_x$) and/or silicon oxide ($SiO_2$). The buffer layer 12 may prevent impurities from the substrate 10 and the black matrix 11 from penetrating therethrough, and may planarize surfaces of the substrate 10 and the black matrix 11. Although a structure of the current embodiment includes the buffer layer 12, the buffer layer 12 may be omitted.

On the emission region 100 of the substrate 10, the pixel electrode 115, the organic emission layer 20, and the opposite electrode 30 may be disposed sequentially. The buffer layer 12 and a first insulating layer 14 may be disposed between the substrate 10 and the pixel electrode 115.

The pixel electrode 115 may be formed of a transparent or a semi-transparent conductive material. The transparent/semi-transparent conductive material may be at least one or more selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 115 may further include a semi-transparent metallic layer (not shown). The semi-transparent metallic layer may include at least one selected from the group consisting of silver (Ag), aluminum (Al) and an alloy thereof, and may be formed of a thickness about 30 nm or less so as to have a certain degree of penetrability.

On an edge of the pixel electrode 115, a first metal layer 116 may be further disposed, and the first metal layer 116 and a third insulating layer 19 partially covering the pixel electrode 115 define the emission region 100. That is, the third insulating layer 19 functions as a pixel-defining layer, and may be formed of an organic or an inorganic material.

The organic emission layer 20 may be formed of a low molecular weight organic material or a high molecular weight organic material. When the organic emission layer 20 is formed of a low molecular weight organic material, a hole transport layer (HTL), a hole injection layer (HIL), an electron transport layer (ETL), an electron injection layer (EIL), and the like may be stacked around the organic emission layer 20, or alternatively, various other layers may be stacked when required. In this regard, examples of available organic materials may include copper phthalocyanine (CuPc), N,N'-di (naphthalene-1-yl)-N,N'-diphenyl-benzidine (NPB), tris(8-hydroxyquinolinato)aluminum (Alq3), and the like. When the organic emission layer 20 is formed of a high molecular weight organic material, an HTL, as well as the organic emission layer 20, may be included. The HTL may be formed of poly(3,4-ethylenedioxythiophene) (PEDOT), polyaniline (PANI), or the like. In this case, organic materials, such as poly-phenylene vinylene (PPV)-based and polyfluorene-based high molecular weight organic material, and the like, may be used.

The opposite electrode 30 may be a reflective electrode including a reflective material. In the current embodiment, the pixel electrode 115 serves as an anode and the opposite electrode 30 serves as a cathode. However, the pixel electrode 115 may serve as a cathode, and the opposite electrode 30 may serve as an anode. The opposite electrode 30 may include at least one or more materials selected from the group consisting of Ag, Al, Mg, Li, Ca, LiF/Ca, and LiF/Al.

The opposite electrode 30 is formed as a reflective electrode so that light emitted from the organic emission layer 20 is reflected by the opposite electrode 30, is transmitted through the pixel electrode 115 formed of a transparent/semi-transparent conductive material, and is emitted toward the substrate 10.

In addition, together with the semi-transparent metallic layer (not shown) included in the pixel electrode 115, the opposite electrode 30 constitutes a resonant structure as a DBR mirror. That is, the semi-transparent metallic layer (not shown) serves as a semi-transparent mirror and the opposite electrode 30 serves as a reflective electrode so that resonance between the opposite electrode 30 and the semi-transparent metallic layer (not shown) may occur.

On the non-emission region 200 of the substrate 10, the thin film transistor Tr (including the active layer 213, the first and second gate electrodes 215 and 216, respectively, and the source and drain electrodes 218a and 218b, respectively), the capacitor Cst (including a lower electrode 313 and an upper electrode 315), and a pad electrode 418 are disposed. The non-emission region 200 may include the non-display region 210, which is the edge region of the substrate 10.

In this regard, the recess 10a is formed in a surface of the substrate 10 facing the thin film transistor Tr, the capacitor Cst, and the pad of the substrate 10, and the black matrix is disposed in the recess 10a. The black matrix 11 prevents a phenomenon where light incident from the outside is reflected by the thin film transistor or the like, thus increasing visibility and contrast.

Also, since a polarizing film for preventing external light reflection may be omitted, a phenomenon where a degree of transmittance of an emitting light decreases due to the polarizing film may be prevented, and thus light efficiency may be increased.

The active layer 213 may be formed of a semiconductor material, such as amorphous silicon or poly silicon, and may include a channel region 213c between a source region 213a and a drain region 213b that are doped with an ion impurity.

The first and second gate electrodes 215 and 216, respectively, are disposed on the active layer 213, and the first insulating layer 14 is disposed between the active layer 213 and the first gate electrode 215. The first insulating layer 14 serves as a gate insulating layer that insulates the first gate electrode 215 of the thin film transistor Tr from the active layer 213.

The first gate electrode 215 and the second gate electrode 216 may be formed of conductive materials with different etching selectivities with respect to each other. The first gate electrode 215 may include a transparent conductive material, such as ITO, IZO, ZnO, $In_2O_3$, or the like, and the second gate electrode 216 may include one or more metallic materials selected from the group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) and may be formed as a single layer or as a multi-layer structure.

A second insulating layer 17 is disposed on the second gate electrode 216, and the source and drain electrodes 218a and 218b, respectively, contact the source and drain regions 213a and 213b, respectively, of the active layer 213, with the second insulating layer 17 being interposed therebetween. The second insulating layer 17 serves as an interlayer insulating layer of the transistor Tr, and the source and drain electrodes 218a and 218b, respectively, may include one or more metallic materials selected from the group consisting of a aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and may be formed as a single layer or as a multi-layer structure.

The pixel electrode 115 electrically connects one of the source and drain electrodes 218a and 218b, respectively. In the current embodiment, one of the source and drain electrodes 218a and 218b, respectively, directly contacts a first metallic layer 116 disposed on the edge of the pixel electrode 115, and is electrically connected to the pixel electrode 115 via the first metallic layer 116.

The third insulating layer 19 may be disposed on the second insulating layer 17 so as to cover the source and drain electrodes 218a and 218b, respectively.

The capacitor Cst is disposed in a region that is separate from the thin film transistor Tr by a predetermined distance. The lower electrode 313 of the capacitor Cst may include the same material used in forming the active layer 213 of the thin film transistor Tr. The upper electrode 315 may include the same material used in forming the pixel electrode 115. If the first insulating layer 14 is disposed between the lower electrode 313 and the upper electrode 315, the first insulating layer 14 serves as a dielectric layer of the capacitor Cst.

The pad electrode 418, which is a connection terminal of an external driver, is disposed in the non-display region 210 of the substrate 10, which is an edge region of the organic light-emitting display apparatus 1. The pad electrode 418 may include the same material as a material used in forming the source and drain electrodes 218a and 218b, respectively.

The pad electrode 418 is disposed on the second insulating layer 17, and no other elements are disposed on the pad electrode 418.

FIGS. 2 through 10 are cross-sectional views sequentially illustrating a method of manufacturing the organic light-emitting display apparatus illustrated in FIG. 1 according to an embodiment of the present invention.

Figure 2:
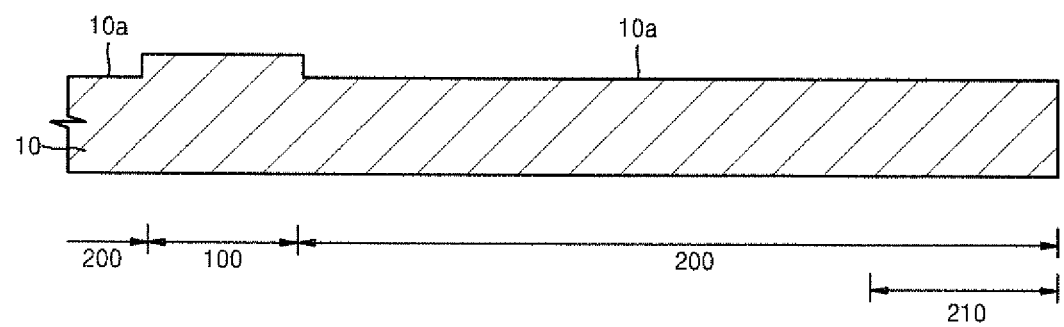
FIGS. 2 through 10 are cross-sectional views sequentially illustrating a method of manufacturing the organic light-emitting display apparatus illustrated in FIG. 1 according to an embodiment of the invention.

Referring to FIG. 2, a substrate 10, including an emission region 100 and a non-emission region 200, is prepared, and a recess 10a is formed in at least a portion of the non-emission region 200 of the substrate 10.

The current embodiment illustrates a case where the recess 10a is formed in the entire surface of the non-emission region 200. However, embodiments of the present invention are not limited thereto, and the recess 10a may only be formed in a portion of the non-emission region 200 or in an edge region of the substrate 10, which is a non-display region 210.

Although a process of manufacturing the recess 10a is not shown in detail, a photoresist (not shown) is applied to the substrate 10, and the substrate 10 is patterned using a photolithography process employing a first mask (not shown), thereby forming the recess 10a. In this regard, the recess 10a may be formed using wet etching of conventional photolithography processes, inkjet patterning, or laser ablation.

Figure 3:
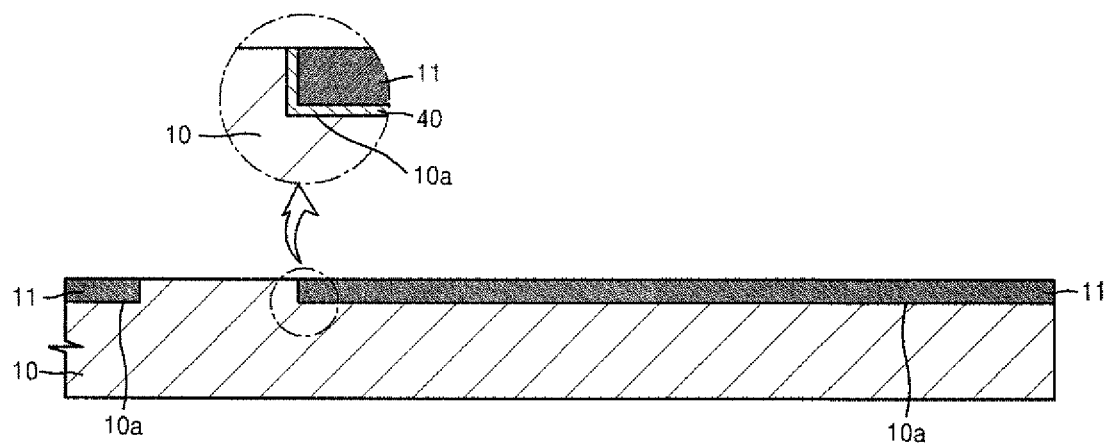

Referring to FIG. 3, a black matrix 11 is formed in the recess 10a. In this regard, the black matrix 11 is buried in the recess 10a, and a depth of the recess 10a and a thickness of the black matrix 11 are the same so that there is no height difference between the recess 10 and the black matrix 11.

The black matrix 11 may be formed of an organic material or an organic-inorganic hybrid material and may include a light-blocking material, such as a metal thin layer, metal particles, carbon black, or a mixture containing carbon black.

The black matrix 11 may be formed by a printing method such as an inkjet printing method or a nozzle printing method. In the case of printing method, the process may be simplified because a vacuum condition is not required. Especially, in the current embodiment, since the recess 10a serves as a bank, the black matrix 11 may be conveniently formed using a printing method without an additional bank.

Before forming the black matrix 11 in the recess 10a, an adhesive member 40, such as frit, may be formed. In this regard, frit, which is a ceramic material, may be disposed in the recess 10a and melted by irradiating a laser or the like thereon, and the black matrix 11 may be formed in the recess 10a to improve adhesion strength between the substrate 10 and the black matrix 11.

Figure 4:
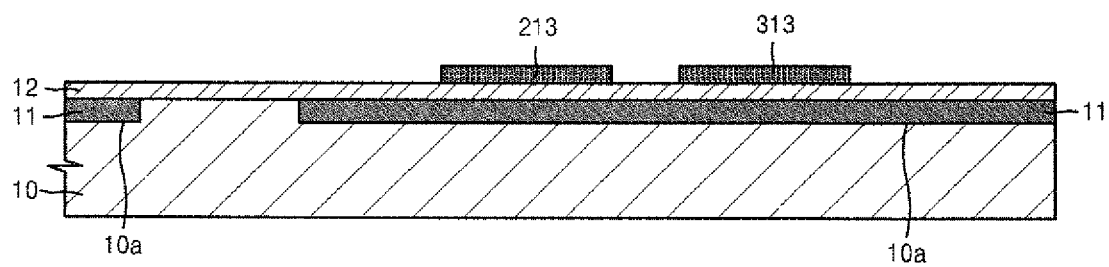

Referring to FIG. 4, a buffer layer 12 is formed over the entire substrate surface 10 so as to cover the black matrix 11, and an active layer 213 of a thin film transistor Tr and a lower electrode 313 of a capacitor Cst are formed on the buffer layer 12.

The buffer layer 12 may be formed of silicon nitride ($SiN_x$) and/or silicon oxide ($SiO_2$). The buffer layer 12 may prevent impurities from the substrate 10 and the black matrix 11 from penetrating therethrough and may planarize surfaces of the substrate 10 and the black matrix 11.

A semiconductor layer may be formed on the entire surface of the buffer layer 12, and then the active layer 213 and the lower electrode 313 may be formed by patterning the semiconductor layer.

The semiconductor layer may be formed of amorphous silicon or polysilicon. The semiconductor layer may be deposited on the buffer layer 12 by using various vapor deposition methods, such as plasma-enhanced chemical vapor deposition (PECVD), atmospheric pressure CVD (APCVD), low pressure CVD (LPCVD), and the like.

The active layer 213 and the lower electrode 313 may be formed by patterning the semiconductor layer by a photolithography process using a second mask (not shown), and the second mask process may be performed by exposing the second mask (not shown) by using an exposure device (not shown), and then by performing a series of processes, such as developing, etching, and stripping or ashing, and the like. Hereinafter, in subsequent mask processes, descriptions already described above are omitted.

Figure 5:
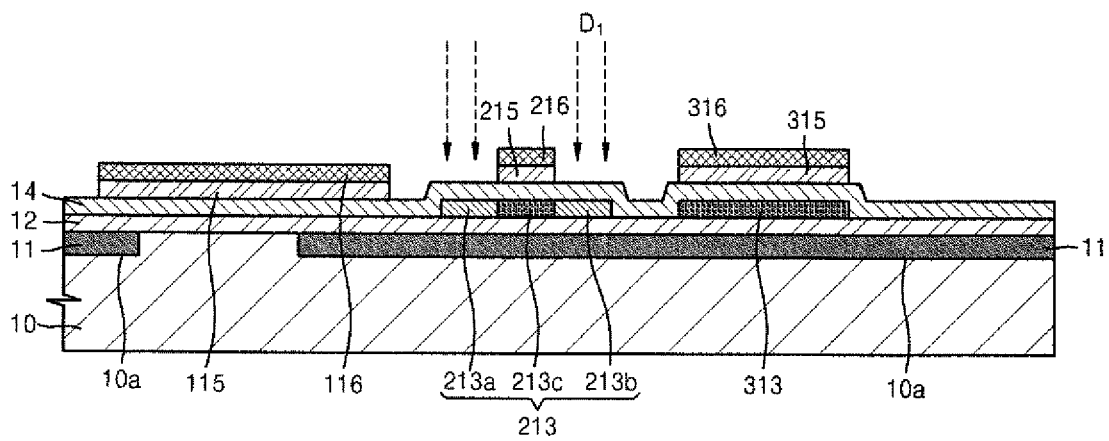

Referring to FIG. 5, a first insulating layer 14 is formed on the entire surface of a resultant structure of FIG. 2, and a pixel electrode 115 and a first metallic layer 116 are formed on the first insulating layer 14 in the emission region 100 by performing a third mask process. A first gate electrode 215 and a second gate electrode 216 are formed on a thin film transistor Tr region of the non-emission region 200, and an upper electrode 315 and a second metallic layer 316 are formed on a capacitor Cst region of the non-emission region 200.

The active layer 213 is doped (D1) with an ion impurity by using the first gate electrode 215 and the second gate electrode 216 that are formed on the first insulating layer 14 as a self-aligned mask, thereby forming a source region 213a and a drain region 213b that are doped with an ion impurity and a channel region 213c that is not doped with an ion impurity.

The first gate electrode 215 and the second gate electrode 216 may include materials with different etching selectivities with respect to each other. For example, the first gate electrode 215 may be formed of a transparent conductive material, such as ITO, IZO, ZnO, $In_2O_3$, or the like, and the second gate electrode 216 may be formed of one or more metallic materials selected from the group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The second gate electrode 216 may be formed as a single layer or a multi-layer structure.

The pixel electrode 115 and the upper electrode 315 are formed of the same materials as materials used in forming the first gate electrode 215, and are disposed on the same layer as a layer on which the first gate electrode 215 is disposed. The first metallic layer 116 and the second metallic layer 316 may be formed of the same materials as materials used in forming the second gate electrode 216, and are disposed on the same layer as a layer on which the second gate electrode 216 is disposed.

Figure 6:
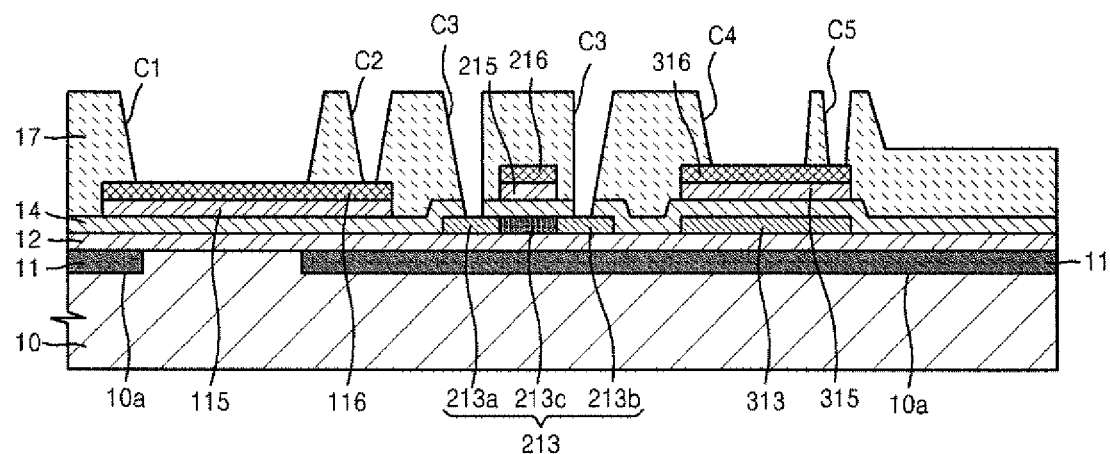

Referring to FIG. 6, a second insulating layer 17 is formed on a resultant structure of FIG. 5. A first opening C1 through which the first metallic layer 116 is exposed, a second opening C2 through which the first metallic layer 116 is electrically connected to one of source and drain electrodes 218a and 218b, respectively, a third opening C3 through which the source and drain regions 213a and 213b, respectively, of the active layer 213 are connected with the source and drain electrodes 218a and 218b, respectively, a fourth opening C4 through which the second metallic layer 316 of the capacitor Cst is exposed, and a fifth opening C5 through which a pad electrode 418 is connected to the second metallic layer 316 are formed in the second insulating layer 17 by performing a fourth mask process.

Figure 7:
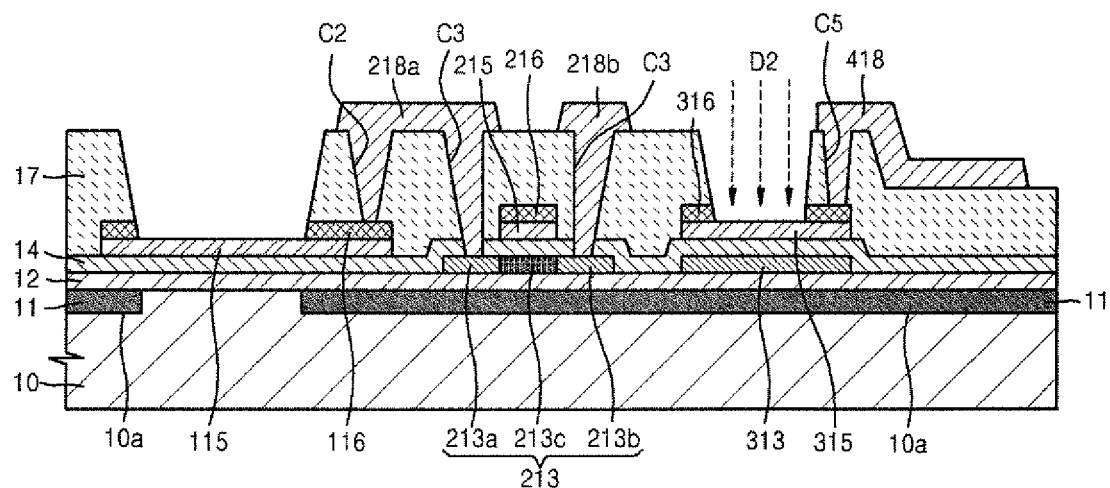

Referring to FIG. 7, the source and drain electrodes 218a and 218b, respectively, and the pad electrode 418 may be formed on the resultant structure of the fourth mask process of FIG. 6 by performing a fifth mask process.

During a patterning process to form the source and drain electrodes 218a and 218b, respectively, the first metallic layer 116 and the second metallic layer 316 are also etched, thereby the pixel electrode 115 and the upper electrode 315 are exposed.

The source and drain electrodes 218a and 218b, respectively, are connected to the source and drain regions 213a and 213b, respectively, of the active layer 213 via the third opening C3. Also, one of the source and drain electrodes 218a and 218b, respectively, is electrically connected via the second opening C2 to the pixel electrode 115, which is in contact with the first metallic layer 116 via the second opening C2.

The pad electrode 418 is disposed on the non-display region 210 of the substrate 10, that is, an edge region of the organic light emitting display apparatus 1, and serves as a connection terminal of an external driver. The pad electrode 418 is electrically connected, via the fifth opening C5, to the second metallic layer 316 and the upper electrode 315 which is in contact with the second metallic layer 316 of the capacitor Cst.

After the fifth mask process, the lower electrode 313 of the capacitor Cst is doped (D2) with an ion impurity.

Figure 8:
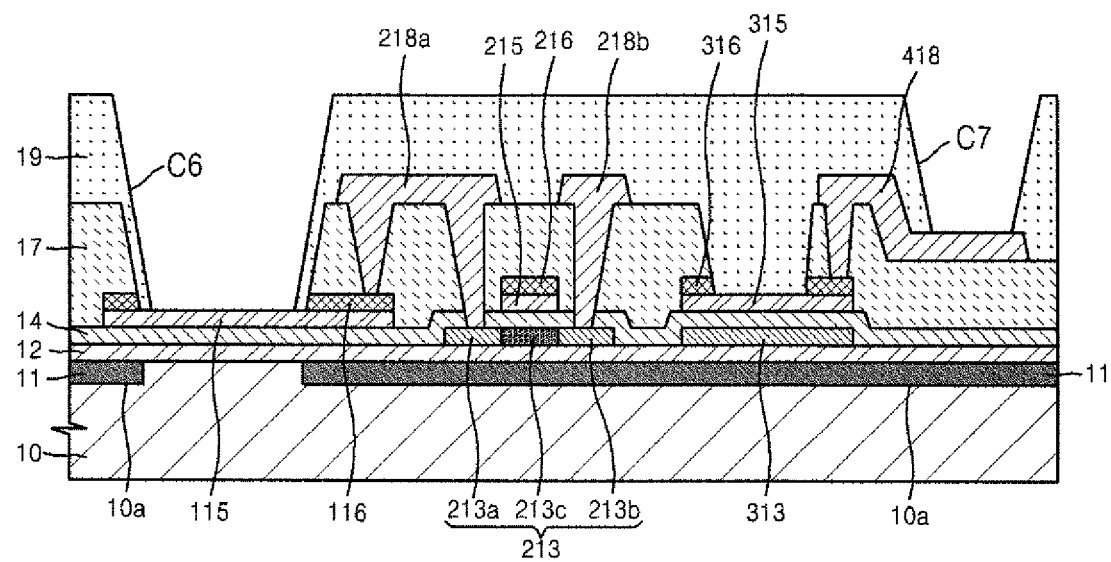

Referring to FIG. 8, a third insulating layer 19 is formed on the resultant structure of FIG. 7, and a sixth opening C6, through which the pixel electrode 115 is exposed, and a seventh opening C7, through which the pad electrode 418 is exposed, are formed in the third insulating layer 19 by performing a sixth mask process.

The sixth opening C6, through which the pixel electrode 115 is exposed, serves as a pixel-defining layer (PDL) that defines an emission region 100.

Referring back to FIG. 1, the organic light-emitting display apparatus 1 may be completely manufactured by forming an organic emission layer 20 and an opposite electrode 30 on the sixth opening C6 of the resultant structure of FIG. 8. The opposite electrode 30 may be formed on the entire surface of the substrate 10 and may serve as a common electrode, but it is not disposed on the pad electrode 418.

Moreover, after forming the opposite electrode 30, the organic light-emitting display apparatus 1 may be sealed using an encapsulation unit (not shown), for example, a glass substrate, a metal substrate, or a thin layer in which organic materials and inorganic materials are alternately stacked.

Figure 9:
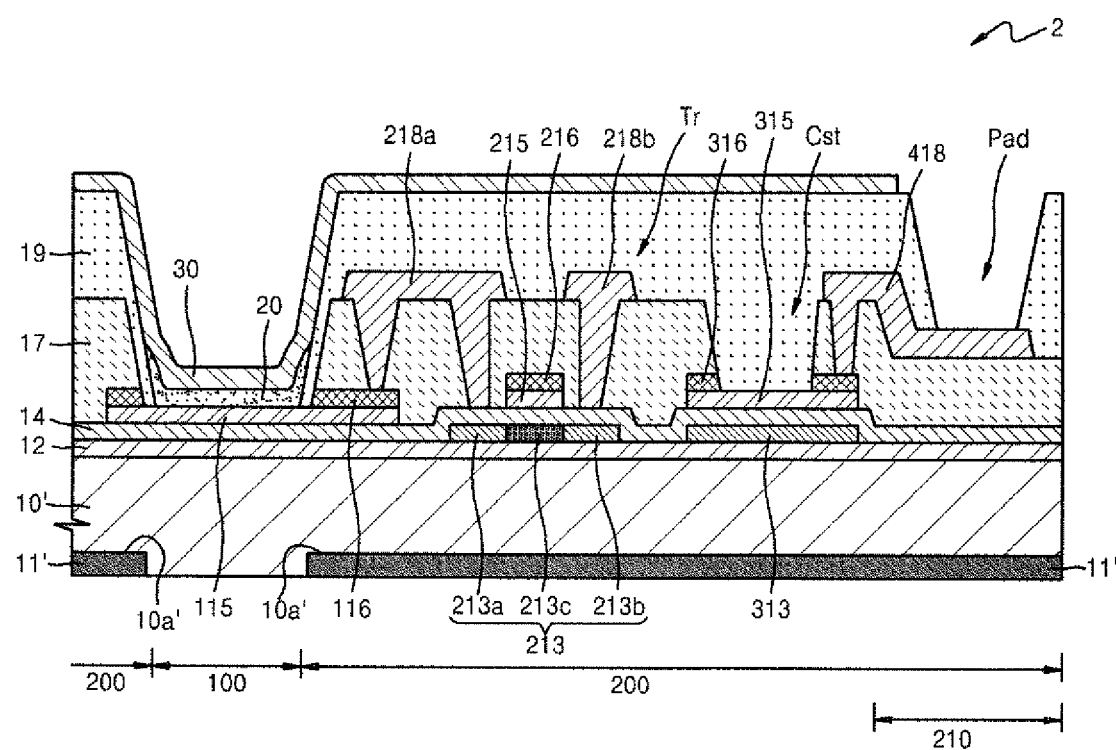

FIG. 9 is a schematic cross-sectional view of an organic light-emitting display apparatus according to another embodiment of the invention.

The organic light-emitting display apparatus 2 according to the current embodiment has substantially the same structure as that of the organic light-emitting display apparatus 1 of FIG. 1. The difference therebetween is the positions of a recess 10a' and a black matrix 11' formed on a substrate 10'.

The recess 10a' is formed on opposite surface of the surface where the thin film transistor Tr of the substrate 10' and the like are disposed, that is, on the surface disposed toward light-emitting direction, and the black matrix 11' is buried in the recess 10a'.

As described above, the black matrix 11' may be formed by a printing method, and an adhesion member (not shown) may be formed in the recess 10a' before forming the black matrix 11'.

Also, the black matrix 11' may be formed after forming the thin film transistor Tr, a capacitor Cst, an organic emission layer 20, and the like, and after sealing with an encapsulation unit (not shown). In this case, deterioration due to forming the black matrix 11' may be prevented.

Figure 10:
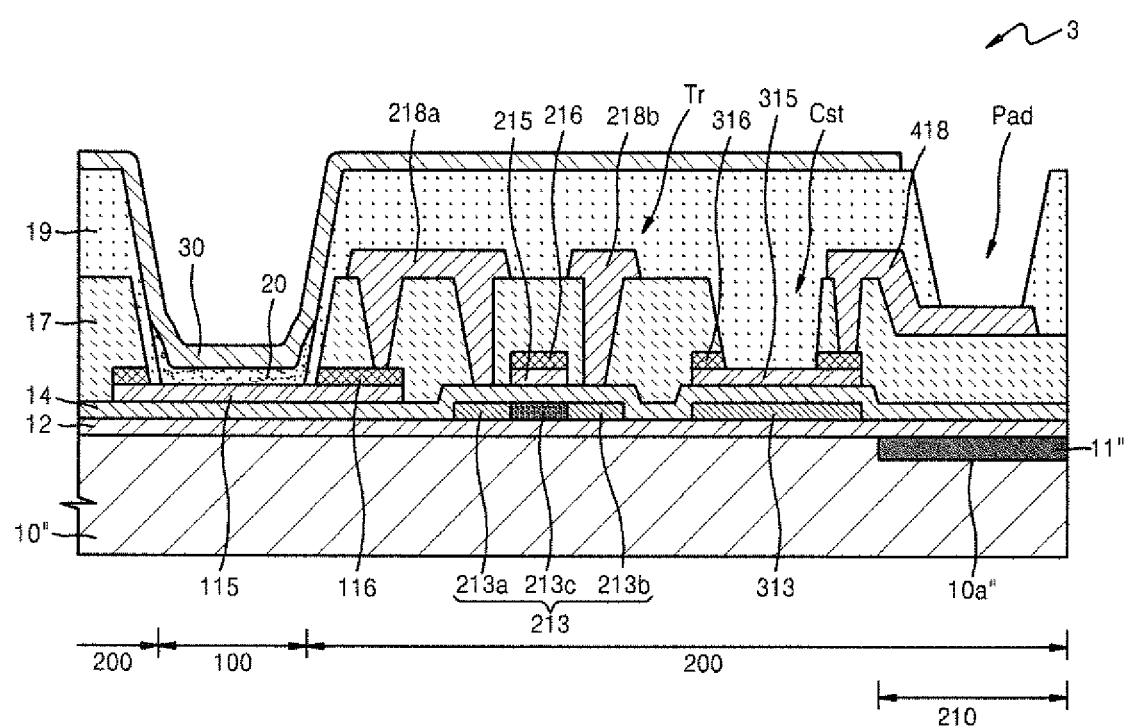

FIG. 10 is a schematic cross-sectional view of an organic light-emitting display apparatus 3 according to another embodiment of the invention.

The organic light-emitting display apparatus 3 according to the current embodiment has substantially the same structure as that of the organic light-emitting display apparatus 1 of FIG. 1. The difference therebetween is the positions of a recess 10a" and a black matrix 11" formed on a substrate 10".

The recess 10a" and the black matrix 11" buried in the recess 10a" may only be formed on a non-display region 210 of the substrate 10", that is, on an edge region of the organic light-emitting display apparatus 3. In the non-display region 210 of the substrate 10", a pad Pad, an integrated circuit (IC) (not shown), and the like may be disposed.

Generally, by disposing the black matrix 11" in the non-display region 210 of the substrate 10", bezels disposed along the edges of the organic light-emitting display apparatus 3 may be omitted.

Figure 11:
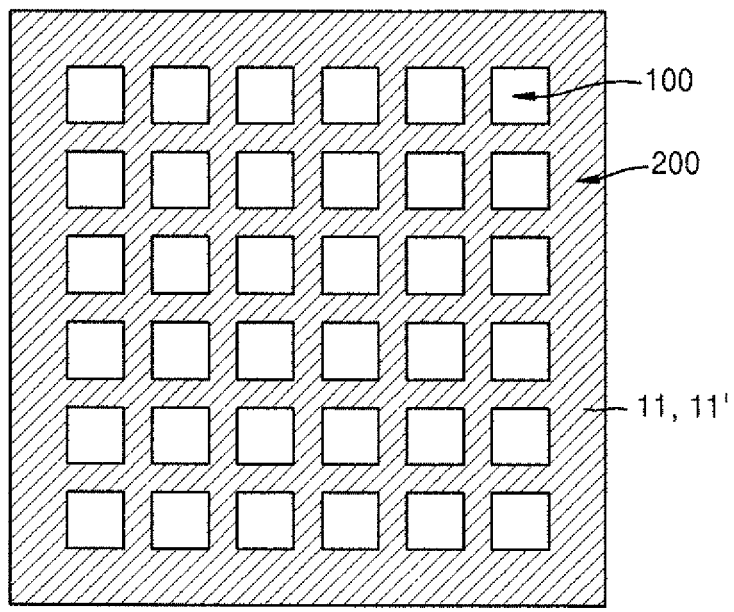
FIG. 11 is a schematic plan view of the organic light-emitting display apparatus of FIG. 1 and FIG. 9.
Figure 12:
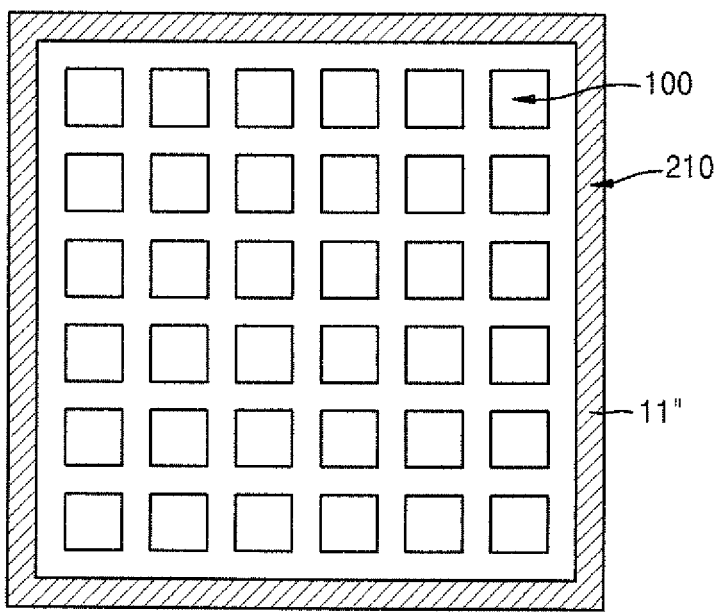
FIG. 12 is a schematic plan view of the organic light-emitting display apparatus of FIG. 10.

FIG. 11 is a schematic plan view of the organic light-emitting display apparatus of FIG. 1 and FIG. 9, and FIG. 12 is a schematic plan view of the organic light-emitting display apparatus of FIG. 10.

The organic light-emitting display apparatus 1 or 2 of FIG. 1 or FIG. 9 has the black matrix 11 or 11' disposed in the entire non-emission region 200 except for the emission region 100, and the organic light-emitting display apparatus 3 of FIG. 10 has the black matrix 11" disposed only in the non-display region 210.

As described above, in an organic light-emitting display apparatus and a method of manufacturing the same, according to embodiments described above, external light reflection may be efficiently reduced without a polarizing film and contrast, and light efficiency may be improved.

Also, subsequent process may be easily performed by forming a black matrix without a height difference. Moreover, the occurrence of gas may be reduced by increasing adhesion strength between a substrate and a black matrix.

In addition, bezels disposed in a non-display region of an organic light-emitting display apparatus may be omitted.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display apparatus, comprising:
    a substrate including an emission region and a non-emission region, and having a recess formed in at least a portion of the non-emission region;
    a black matrix disposed in the recess;
    a thin film transistor disposed in the non-emission region of the substrate, and including an active layer, a gate electrode, a source electrode and a drain electrode;
    a pixel electrode disposed in the emission region of the substrate and electrically connected to one of the source electrode and the drain electrode;
    an organic emission layer disposed on the pixel electrode;
    an opposite electrode disposed on the organic emission layer; and
    an adhesive member disposed between and spatially completely separating the substrate and the black matrix.

2. The organic light-emitting display apparatus of claim 1, wherein the recess is formed throughout the non-emission region.

3. The organic light-emitting display apparatus of claim 1, wherein the recess is formed in a surface facing the thin film transistor.

4. An organic light-emitting display apparatus, comprising:
- a substrate including an emission region and a non-emission region, and having a recess formed in at least a portion of the non-emission region;
- a black matrix disposed in the recess;
- a thin film transistor disposed in the non-emission region of the substrate, and including an active layer, a gate electrode, a source electrode and a drain electrode;
- a pixel electrode disposed in the emission region of the substrate and electrically connected to one of the source electrode and the drain electrode;
- an organic emission layer disposed on the pixel electrode; and
- an opposite electrode disposed on the organic emission layer;
- wherein the recess is formed in a surface of the substrate opposite to a surface of the substrate facing the thin film transistor.

5. The organic light-emitting display apparatus of claim 1, thickness of the black matrix planarizes the recess.

6. The organic light-emitting display apparatus of claim 1, wherein the black matrix comprises one of an organic material and an organic-inorganic hybrid material.

7. The organic light-emitting display apparatus of claim 1, wherein the non-emission region comprises a non-display region corresponding to an edge region of the substrate.

8. The organic light-emitting display apparatus of claim 7, wherein the recess is only formed in the non-display region.

9. A method of manufacturing an organic light-emitting display apparatus, the method comprising the steps of:
- forming a recess in at least a portion of a non-emission region of a substrate which includes an emission region and the non-emission region;
- forming a black matrix in the recess;
- forming a thin film transistor, including an active layer, a gate electrode, a source electrode and a drain electrode, on the non-emission region of the substrate;
- forming a pixel electrode which is electrically connected to one of the source electrode and the drain electrode;
- forming an organic emission layer on the pixel electrode;
- forming an opposite electrode on the organic emission layer; and
- forming or applying an adhesive member in the recess before forming the black matrix, the adhesive member disposed between and spatially completely separating the substrate and the black matrix.

10. The method of claim 9, wherein the step of forming the recess comprises forming the recess throughout the non-emission region.

11. The method of claim 9, wherein the step of forming the recess comprises forming the recess along edges of the substrate.

12. The method of claim 9, wherein the step of forming the recess comprises forming the recess in a surface facing the thin film transistor.

13. The method of claim 9, wherein the step of forming the recess comprises forming the recess in a surface opposite a surface facing the thin film transistor.

14. The method of claim 9, wherein the step of forming the recess comprises forming the recess using one of photolithography, inkjet patterning and laser ablation.

15. The method of claim 9, wherein the step of forming the black matrix comprises forming the black matrix so as to have a thickness the same as a depth of the recess.

16. The method of claim 9, wherein the black matrix comprises one of an organic material and an organic-inorganic hybrid material.

17. The method of claim 16, wherein the step of forming the black matrix comprises forming the black matrix using a printing method.

18. An organic light-emitting display apparatus manufactured by a method comprising the steps of:
- forming a recess in at least a portion of a non-emission region of a substrate which includes an emission region and the non-emission region;
- forming a thin film transistor, including an active layer, a gate electrode, a source electrode and a drain electrode, on the non-emission region of the substrate;
- forming a pixel electrode which is electrically connected to one of the source electrode and the drain electrode;
- forming an organic emission layer on the pixel electrode; and
- forming an opposite electrode on the organic emission layer;
- wherein the pixel electrode is disposed in the emission region of the substrate;
- wherein the organic light-emitting display apparatus comprises a recess formed in at least a portion of the non-emission region of the substrate, and a black matrix disposed in the recess; and
- wherein the recess is formed in a surface of the substrate opposite to a surface of the substrate facing the thin film transistor.

* * * * *